(12) United States Patent
Chen et al.

(10) Patent No.: US 9,354,666 B2
(45) Date of Patent: May 31, 2016

(54) ELECTRONIC DEVICE AND OPERATING METHOD THEREOF

(71) Applicants: Li-Fang Chen, Taipei (TW); Yung-Hsiang Chen, Taipei (TW); Pei-Pin Huang, Taipei (TW)

(72) Inventors: Li-Fang Chen, Taipei (TW); Yung-Hsiang Chen, Taipei (TW); Pei-Pin Huang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 249 days.

(21) Appl. No.: 13/897,449

(22) Filed: May 20, 2013

(65) Prior Publication Data

US 2013/0314860 A1 Nov. 28, 2013

Related U.S. Application Data

(60) Provisional application No. 61/650,456, filed on May 22, 2012.

(51) Int. Cl.
*G06F 1/16* (2006.01)
*H05K 7/02* (2006.01)
*H05K 5/00* (2006.01)
*H05K 7/00* (2006.01)

(52) U.S. Cl.
CPC .............. *G06F 1/1662* (2013.01); *G06F 1/162* (2013.01); *G06F 1/1616* (2013.01); *G06F 1/1618* (2013.01); *G06F 1/1624* (2013.01); *G06F 1/1637* (2013.01); *G06F 1/1664* (2013.01); *G06F 1/1667* (2013.01); *G06F 1/1669* (2013.01); *G06F 1/1681* (2013.01); *H05K 7/02* (2013.01); *Y10T 16/540255* (2015.01)

(58) Field of Classification Search
CPC ..... G06F 1/1616; G06F 1/1618; G06F 1/162; G06F 1/1624; G06F 1/1662; G06F 1/1664; G06F 1/1667; G06F 1/1669
USPC ............. 361/679.08, 679.09, 679.11, 679.12, 361/679.13, 679.14, 679.15, 679.16, 361/679.17, 679.2, 679.27, 679.28, 679.29
See application file for complete search history.

(56) References Cited

U.S. PATENT DOCUMENTS

| | | | | |
|---|---|---|---|---|
| 5,534,891 | A | * | 7/1996 | Takano .......................... 345/169 |
| 5,706,167 | A | * | 1/1998 | Lee ............................ 361/679.55 |
| 2002/0080570 | A1 | * | 6/2002 | Riddiford ...................... 361/683 |

FOREIGN PATENT DOCUMENTS

| | | |
|---|---|---|
| TW | I263128 | 10/2006 |
| TW | I355883 | 1/2012 |

* cited by examiner

*Primary Examiner* — Hoa C Nguyen
*Assistant Examiner* — Binh Tran
(74) *Attorney, Agent, or Firm* — Jianq Chyun IP Office

(57) ABSTRACT

An electronic device including a first body, an input module and a second body is provided. The first body has a positioning structure. The input module is slidably disposed on the first body and positioned at a first position by the positioning structure. The second body is pivoted with the first body. When the second body is expanded relative to the first body to obtain a first included angle between the first body and the second body, the second body drives the positioning structure to release the input module, such that the input module is capable of sliding from the first position to a second position relative to the first body and separating from the positioning structure.

13 Claims, 10 Drawing Sheets

ELECTRONIC DEVICE AND OPERATING METHOD THEREOF

CROSS-REFERENCE TO RELATED APPLICATION

This application claims the priority benefits of U.S. provisional application Ser. No. 61/650,456, filed on May 22, 2012. The entirety of the above-mentioned patent applications is hereby incorporated by reference herein and made a part of this specification.

BACKGROUND

1. Technical Field

The invention relates to an electronic device and an operating method thereof, and more particularly, to an electronic device having an input module and an operating method thereof.

2. Related Art

Since notebook computers have the same functions as common desktop computers, and with the light-thin design that allows users to carry conveniently, the notebook computers have become an indispensable tool for some users. As the price of the notebook computers falls constantly, some users even directly replace their desktop computer with a notebook computer.

In general, the notebook computers have an input module (such as a keyboard) on a host thereof, and some keyboards of the notebook computers are designed to automatically slide to a position adopted for the user to operate as the screen expands, in order for the user to operate the keyboard more comfortably. However, in the current designs, when the keyboard automatically slides to the position as the screen expands, the keyboard may continuously engage with a positioning structure and an actuating structure on the host, such that it is difficult for the user to arbitrarily adjust the position of the keyboard under the condition that the screen is expanded, thereby causing inconvenient to use.

SUMMARY

The invention is directed to an electronic device, which a position of an input module thereof can be adjusted conveniently.

The invention is directed to an operating method of an electronic device, which is capable of adjusting a position of an input module conveniently.

The invention provides an electronic device including a first body, an input module and a second body. The first body has a positioning structure. The input module is slidably disposed on the first body and positioned at a first position by the positioning structure. The second body is pivoted with the first body, in which when the second body is expanded relative to the first body to obtain a first included angle between the first body and the second body, the second body drives the positioning structure to release the input module, so that the input module is capable of sliding from the first position to a second position relative to the first body and separating from the positioning structure.

In an embodiment of the invention, when the second body is expanded from the first body and the input module is forced to slide from the second position to the first position relative to the first body, the positioning structure positions the input module at the first position.

In an embodiment of the invention, when a second included angle greater than the first included angle exists between the first body and the second body and the input module is positioned at the first position by the positioning structure, the second body is adapted to pivot relative to the first body so that the second included angle is reduced to a third included angle, so as to drive the positioning structure to release the input module by the second body.

In an embodiment of the invention, the electronic device further includes an elastic element, in which the elastic element is connected between the first body and the input module, and when the positioning structure releases the input module, the input module is capable of sliding from the first position to the second position relative to the first body through an elastic force of the elastic element.

In an embodiment of the invention, the second body is connected to the input module, and when the positioning structure releases the input module and the first included angle exists between the first body and the second body, the second body resists the elastic force of the elastic element to prevent the input module sliding from the first position to the second position relative to the first body, and when the second body continuously expands relative to the first body so that the first included angle is increased to a fourth included angle, the input module slides from the first position to the second position relative to the first body through the elastic force of the elastic element.

In an embodiment of the invention, the second body includes a main body and a supporting assembly, in which the supporting assembly is pivoted with the first body, the main body is slidably disposed on the supporting assembly, and when the supporting assembly is pivoted relative to the first body so that the main body expands from the first body, the main body is adapted to slide relative to the supporting assembly, so as to vary a relative position of the first body and the second body are varied.

In an embodiment of the invention, the positioning structure includes an elastic positioning element, in which the input module has a positioning portion and is positioned at the first position by a structural interference between the positioning portion and the elastic positioning element, and when the second body pushes against the elastic positioning element so that the elastic positioning element is elastically deformed, the structural interference between the positioning portion and the elastic positioning element is removed to release the input module.

In an embodiment of the invention, the second body has a rotation shaft and is pivoted with the first body by the rotation shaft, in which a pushing element is disposed on the rotation shaft, the pushing element has a protrusion, and the pushing element is adapted to be driven through a pivot of the second body relative to the first body, so that the protrusion pushes against the positioning structure to drive the positioning structure to release the input module.

In an embodiment of the invention, after the second body is expanded relative to the first body, the protrusion is adapted to move away from the positioning structure through the pivot of the second body relative to the first body.

In an embodiment of the invention, the second body has a housing, and the rotation shaft is disposed in the housing, in which the housing has an opening, the protrusion protrudes out of the housing via the opening, and when the second body is pivoted relative to the first body, the housing pushes the protrusion through an inner wall of the opening.

In an embodiment of the invention, the electronic device further includes at least one sensing element, in which the sensing element is disposed on the first body or the input module, the first body has a touch module, the input module slides to the first position to expose the touch module or slides to the second position to shield the touch module, and when the input module slides to the second position to trigger the sensing element, the first body turns the touch module off.

The invention provides an operating method of an electronic device. The electronic device includes a first body, an input module and a second body. The first body has a positioning structure, the input module is slidably disposed on the first body, and the second body is pivoted with the first body. The operating method includes the following steps. When the input module is positioned at a first position by the positioning structure, the second body is driven to expand relative to the first body to obtain a first included angle between the first body and the second body, so as to drive the positioning structure to release the input module by the second body. After the positioning structure releases the input module, the input module is driven to slide from the first position to a second position relative to the first body and is separated from the positioning structure. When the input module is located at the second position, the input module is driven to slide from the second position to the first position relative to the first body, so as to position the input module at the first position by the positioning structure.

In an embodiment of the invention, the operating method further includes the following step. When a second included angle greater than the first included angle exists between the first body and the second body and the input module is positioned at the first position by the positioning structure, the second body is driven to pivot relative to the first body so that the second included angle is reduced to a third included angle, so as to drive the positioning structure to release the input module by the second body.

According to the foregoing, the first body of the invention has the positioning structure that is configured to position the input module at the first position, and when the input module slides from the first position to the second position as the second body expands, the input module is separated from the positioning structure. As described above, since the input module is not continuously contacted with the positioning structure on the first body, the user can push the input module located at the second position back to the first position under the condition that the second body is expanded, so as to facilitate adjusting the position of the input module according to the actual requirement, thereby improving utilization convenience of the electronic device.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DETAILED DESCRIPTION OF DISCLOSED EMBODIMENTS

Figure 1:
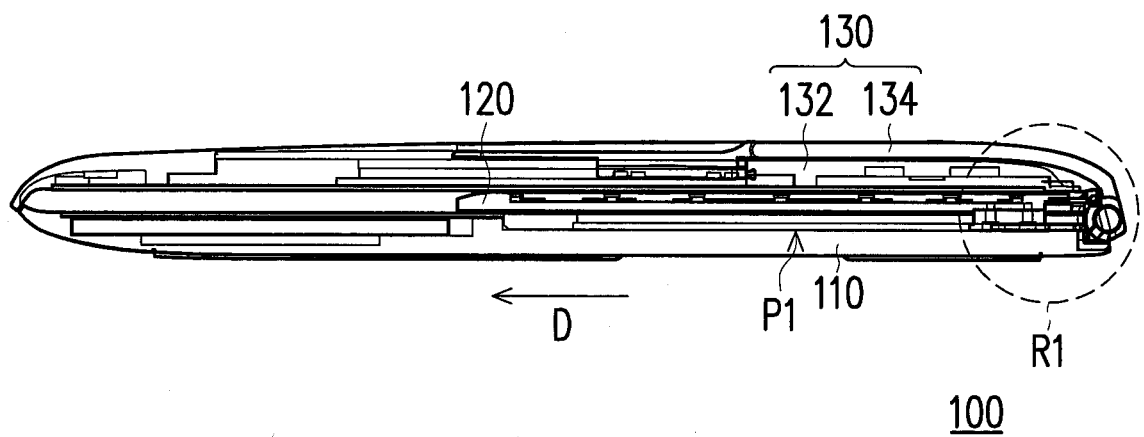
FIG. 1 is a schematic cross-sectional diagram illustrating an electronic device according to an embodiment of the invention.
Figure 2:
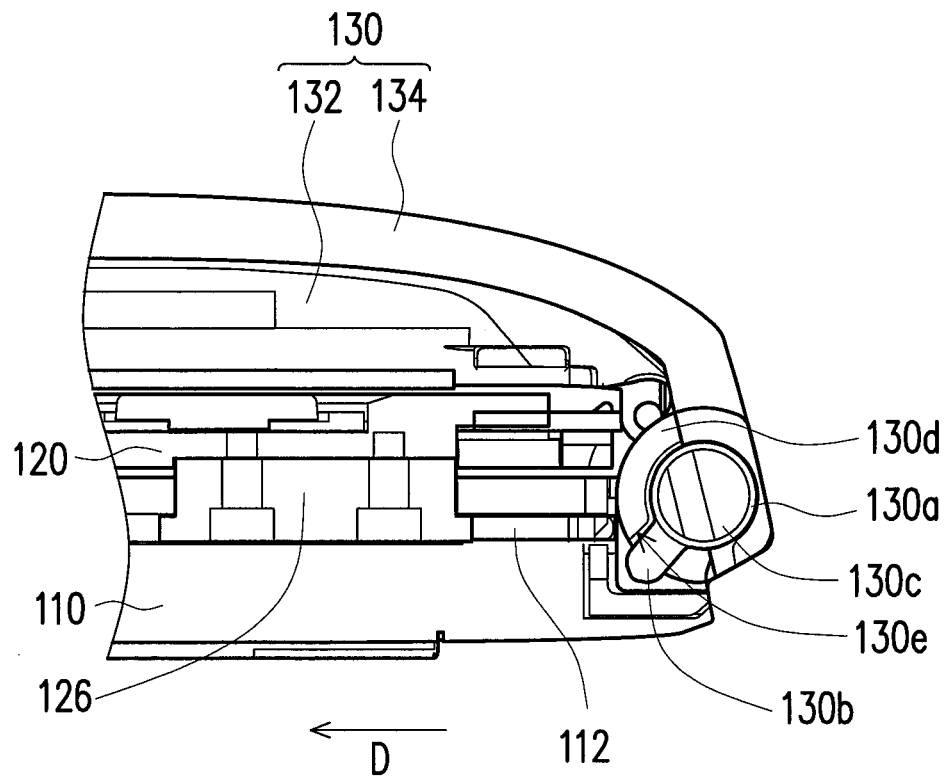
FIG. 2 is an enlarged diagram illustrating a region R1 of the electronic device depicted in FIG. 1.

FIG. 1 is a schematic cross-sectional diagram illustrating an electronic device according to an embodiment of the invention. FIG. 2 is an enlarged diagram illustrating a region R1 of the electronic device depicted in FIG. 1. Referring to FIG. 1 and FIG. 2, the electronic device 100 of the embodiment may be, for instance, a notebook computer, and includes a first body 110, an input module 120 and a second body 130. The second body 130 is pivoted with the first body 110, the input module 120 is slidably disposed on the first body 110 along a direction D. For example, the first body 110 and the second body 130 may respectively be a host and a screen of the notebook computer, and the input module 120 may be a keyboard module. The first body 110 has a positioning structure 112, the input module 120 is positioned at a first position P1 by the positioning structure 112. The second body 130 has a pushing element 130a. The pushing element 130a is configured to push against the positioning structure 112 via a protrusion 130b to release the input module 120. The manner that the second body 130 drives the protrusion 130b to push against the positioning structure 112 is described in detail hereinafter with reference to the drawings.

Figure 3A:
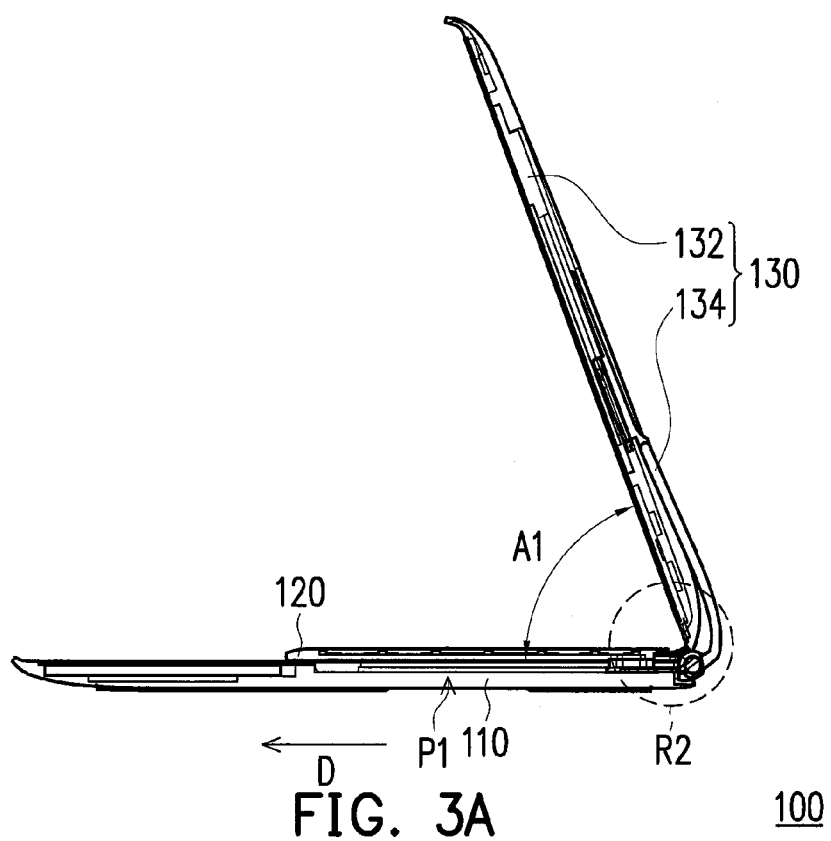
FIG. 3A through FIG. 3F are schematic diagrams illustrating an operation flow of the electronic device depicted in FIG. 1.
Figure 3B:
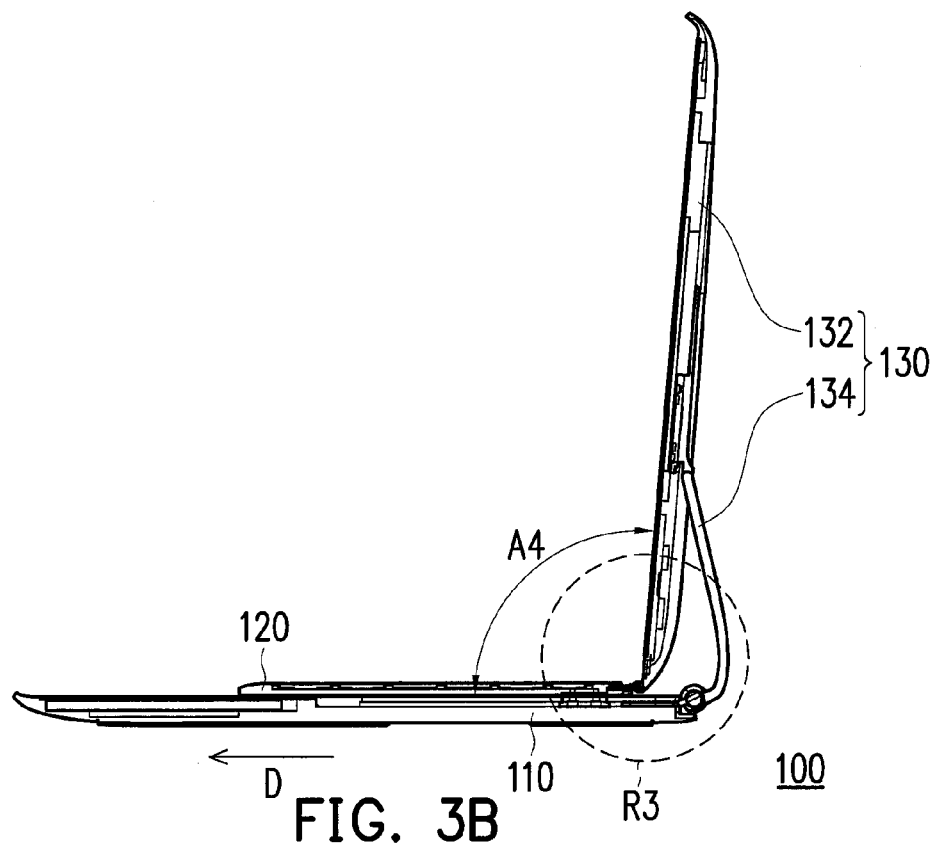
Figure 4:
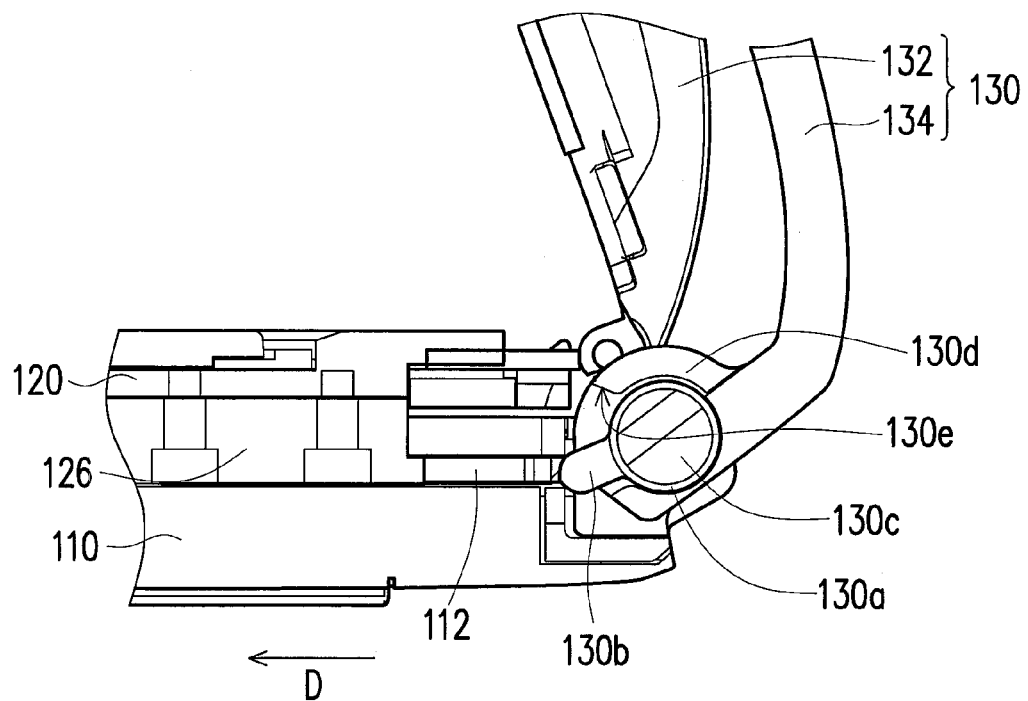
FIG. 4 is an enlarged diagram illustrating a region R2 of the electronic device depicted in FIG. 3A.
Figure 5:
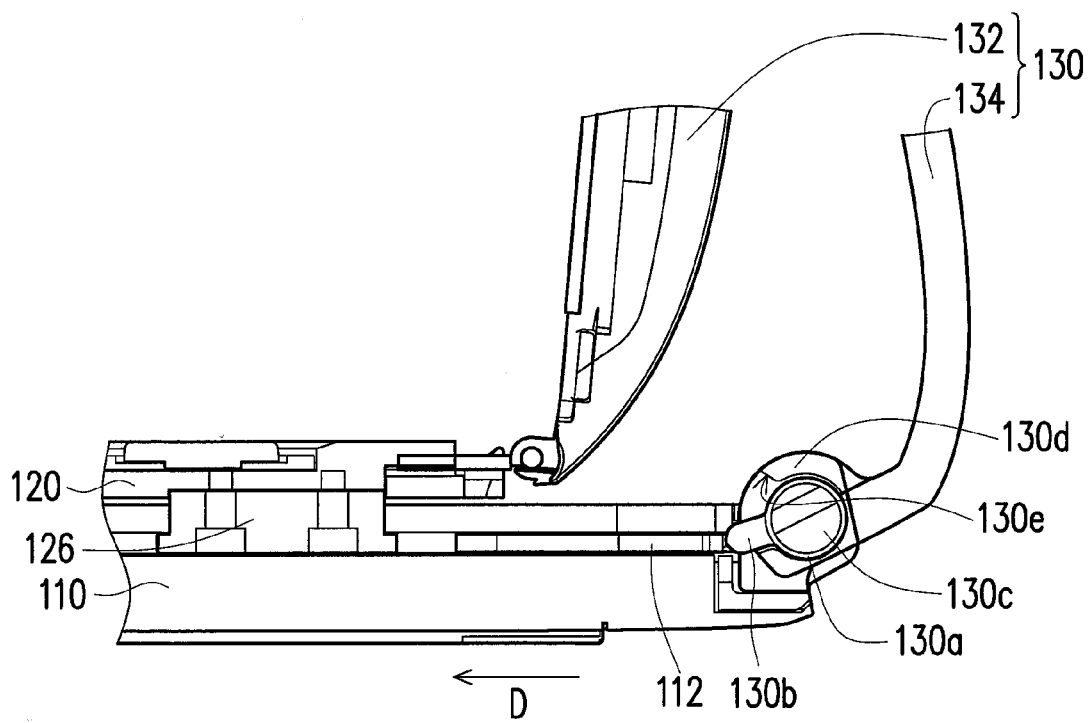
FIG. 5 is an enlarged diagram illustrating a region R3 of the electronic device depicted in FIG. 3B.
Figure 6:
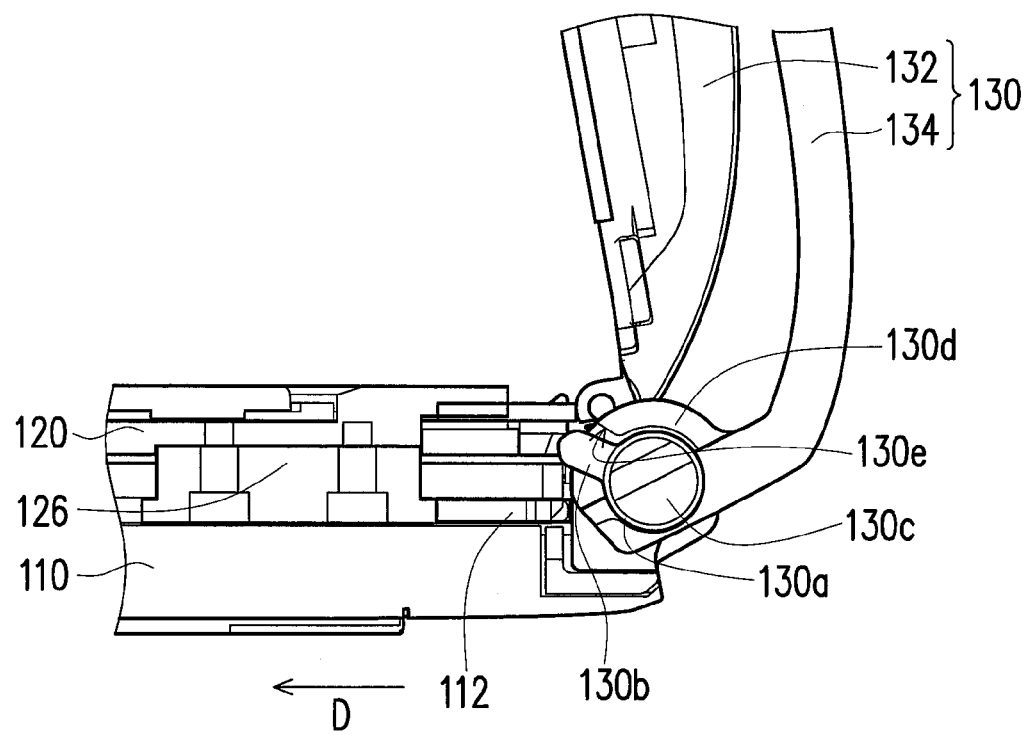
FIG. 6 is an enlarged diagram illustrating a region R4 of the electronic device depicted in FIG. 3D.
Figure 7:
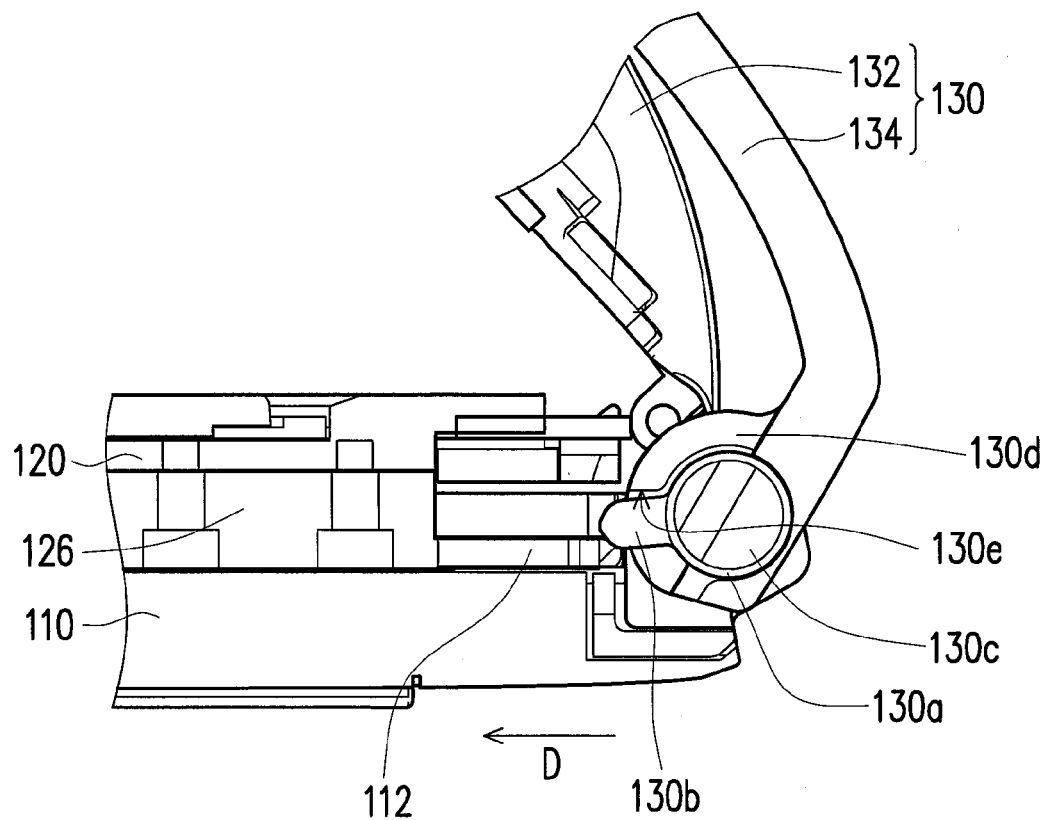
FIG. 7 is an enlarged diagram illustrating a region R5 of the electronic device depicted in FIG. 3E.

FIG. 3A through FIG. 3F are schematic diagrams illustrating an operation flow of the electronic device depicted in FIG. 1. FIG. 4 is an enlarged diagram illustrating a region R2 of the electronic device depicted in FIG. 3A. FIG. 5 is an enlarged diagram illustrating a region R3 of the electronic device depicted in FIG. 3B. FIG. 6 is an enlarged diagram illustrating a region R4 of the electronic device depicted in FIG. 3D. FIG. 7 is an enlarged diagram illustrating a region R5 of the electronic device depicted in FIG. 3E. When the second body 130 is expanded relative to the first body 130 to obtain a first included angle A1 between the first body 110 and the second body 130 (as shown in FIG. 3A and FIG. 4), the second body 130 may push against the positioning structure 112 via the protrusion 130b of the pushing element 130a, so as to drive the positioning structure 112 to release the input module 120, such that the input module 120 is capable of sliding along the direction D relative to the first body 110 to deviate from the positioning structure 112 (as shown in FIG. 3B and FIG. 5). At this moment, the input module 120 may continuously slide along the direction D relative to the first body 110 to reach a second position P2 shown in FIG. 3C, and under such condition the input module 120 is separated from the positioning structure 112. The afore-described included angle A1 may be, for instance, 45 degrees, 60 degrees, 70 degrees or other appropriate angles, although the invention is not limited thereto.

Figure 3C:
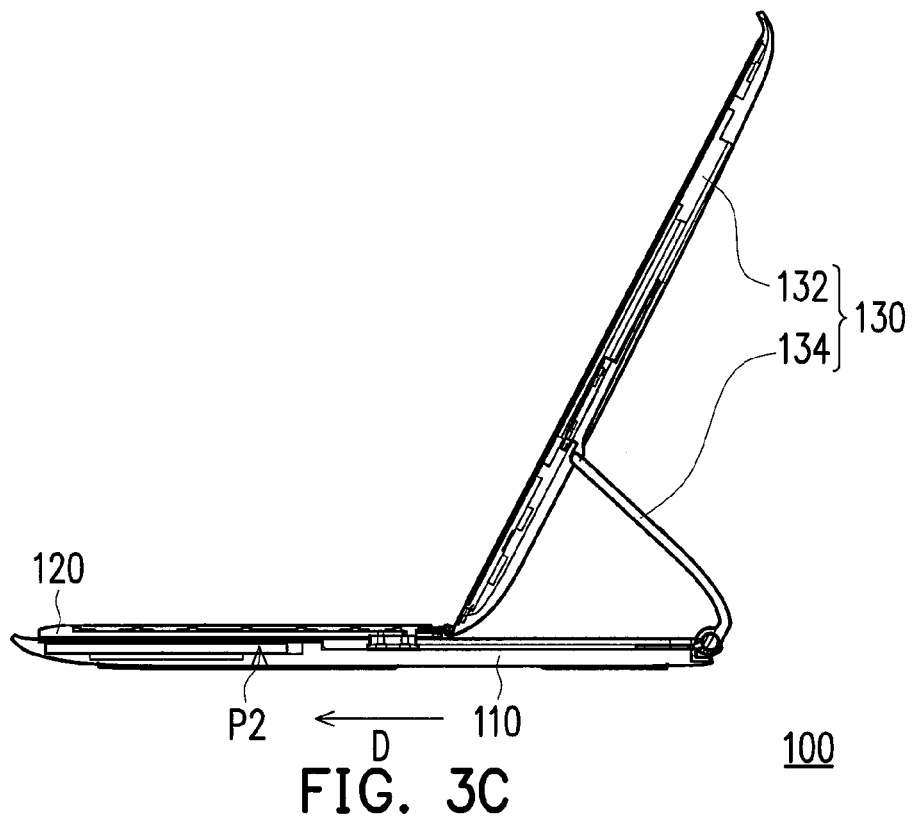

During the process of the input module 120 sliding from the first position P1 shown in FIG. 3A to the second position P2 shown in FIG. 3C as the second body 130 expands, as described above, the input module 120 is not continuously contacted with the positioning structure 112 on the first body 110, and after the second body 130 is expanded relative to the first body 110, the protrusion 130b of the pushing element 130a is adapted to move away from the positioning structure 112 through a pivot of the second body 130 relative to the first body 110. Therefore, the user is capable of pushing the input module 120 located at the second position P2 back to the first position P1 under the condition that the second body 130 is expanded, so as to facilitate adjusting the position of the input module 120 according to the actual requirement, thereby improving utilization convenience of the electronic device 100. Specifically, when the user intends the input module 120 shown in FIG. 3C to return, the input module 120 may be pushed along a direction opposite to the direction D under the condition that the second body 130 is expanded from the first body 110 and the protrusion 130b of the pushing element 130a is away from the positioning structure 112 through the pivot of the second body 130, such that the input module 120 is forced to slide from the second position P2 shown in FIG. 3C to the states shown in FIG. 3D and FIG. 6 relative to the first body 110. At this moment, the input module 120 is returned to the first position P1 and engaged with the positioning structure 112 once again, and the positioning structure 112 without being pushed against by the protrusion 130b may position the input module 120 at the first position P1.

Figure 3D:
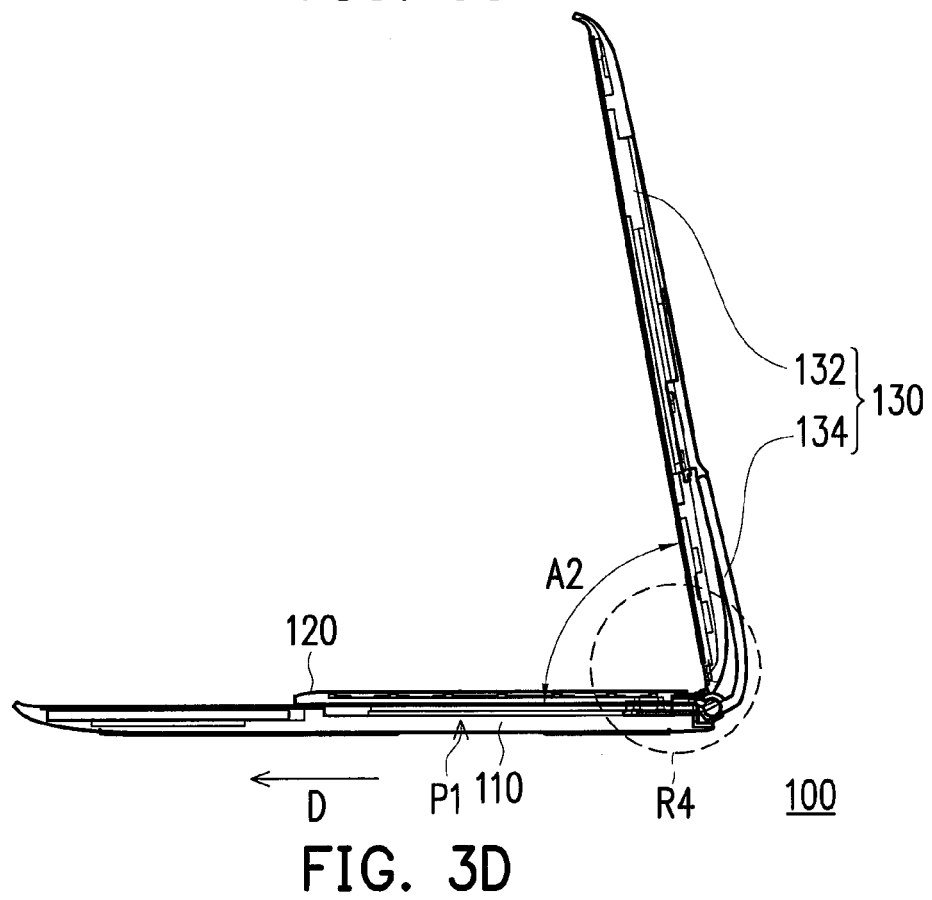

After the input module 120 is positioned at the first position P1 as described above to become the state shown in FIG. 3D, if the user intends to adjust the position of the input module 120, the positioning structure 112 may be driven to release the input module 120 through the pivot of the second body 130 once again, and the detailed descriptions are explicated below. As shown in FIG. 3D and FIG. 6, when a second included angle A2 greater than the first included angle A1 (as indicated in FIG. 3A) exists between the first body 110 and the second body 130 and the input module 120 is positioned at the first position P1 by the positioning structure 112, the user may apply a force to the second body 130, so as to pivot the second body 130 relative to the first body 110 so that the second included angle A2 is reduced to a third included angle A3 shown in FIG. 3E. At this moment, the protrusion 130b of the pushing element 130a pushes against the positioning structure 112 as the second body 130 pivots (as shown in FIG. 7), so as to drive the positioning structure 112 to release the input module 120. After the positioning structure 112 releases the input module 120, the user is capable of adjusting the input module 120 to the second position P2 shown in FIG. 3C or other appropriate positions along the direction D.

Figure 3E:
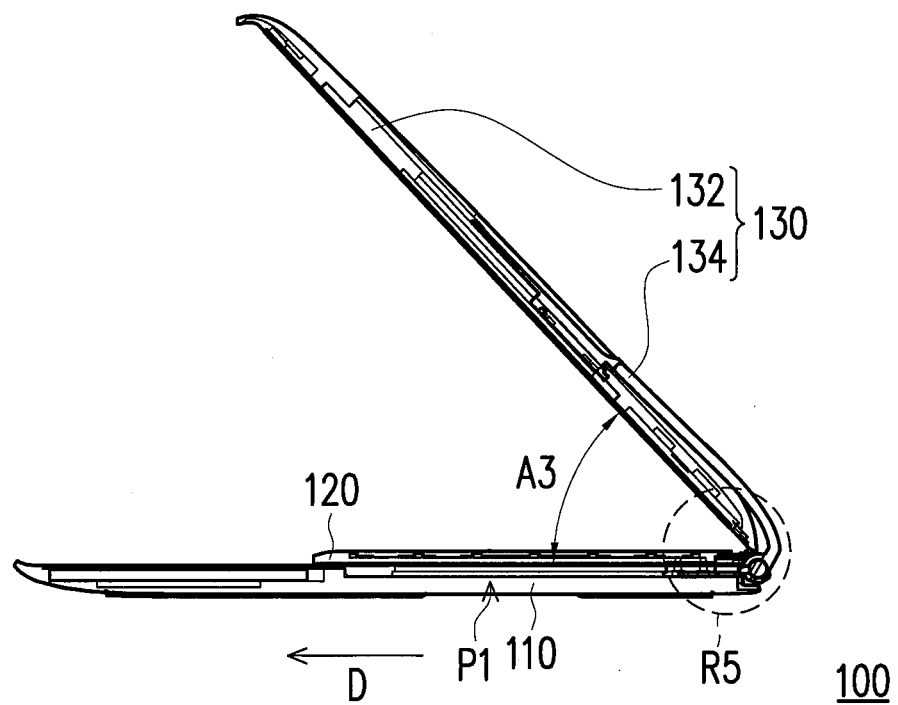
Figure 3F:
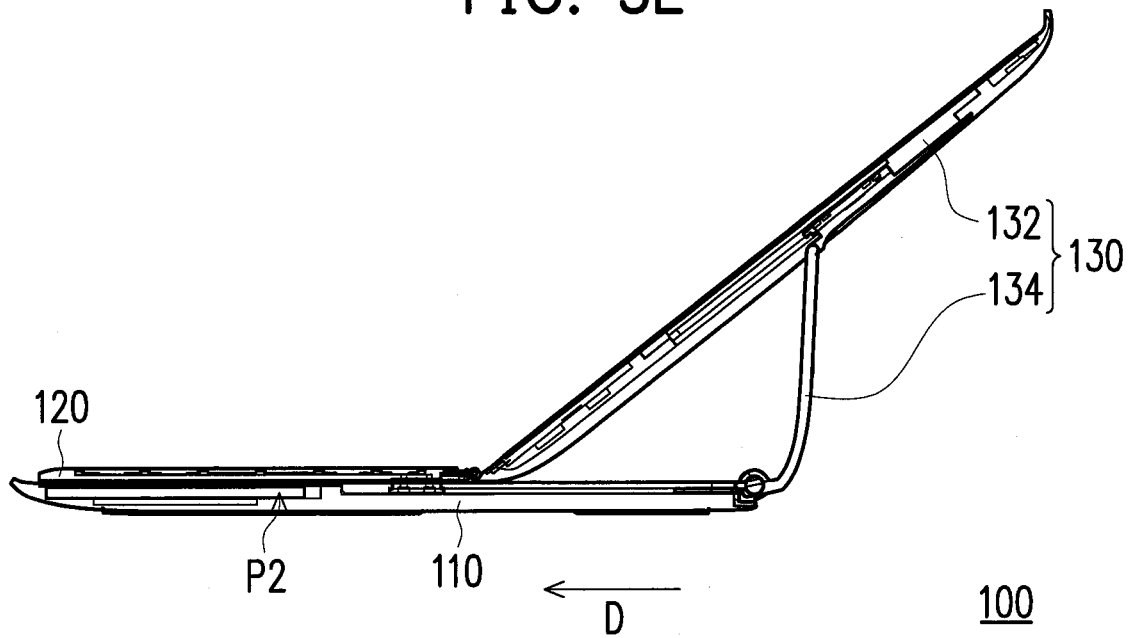
Figure 8:
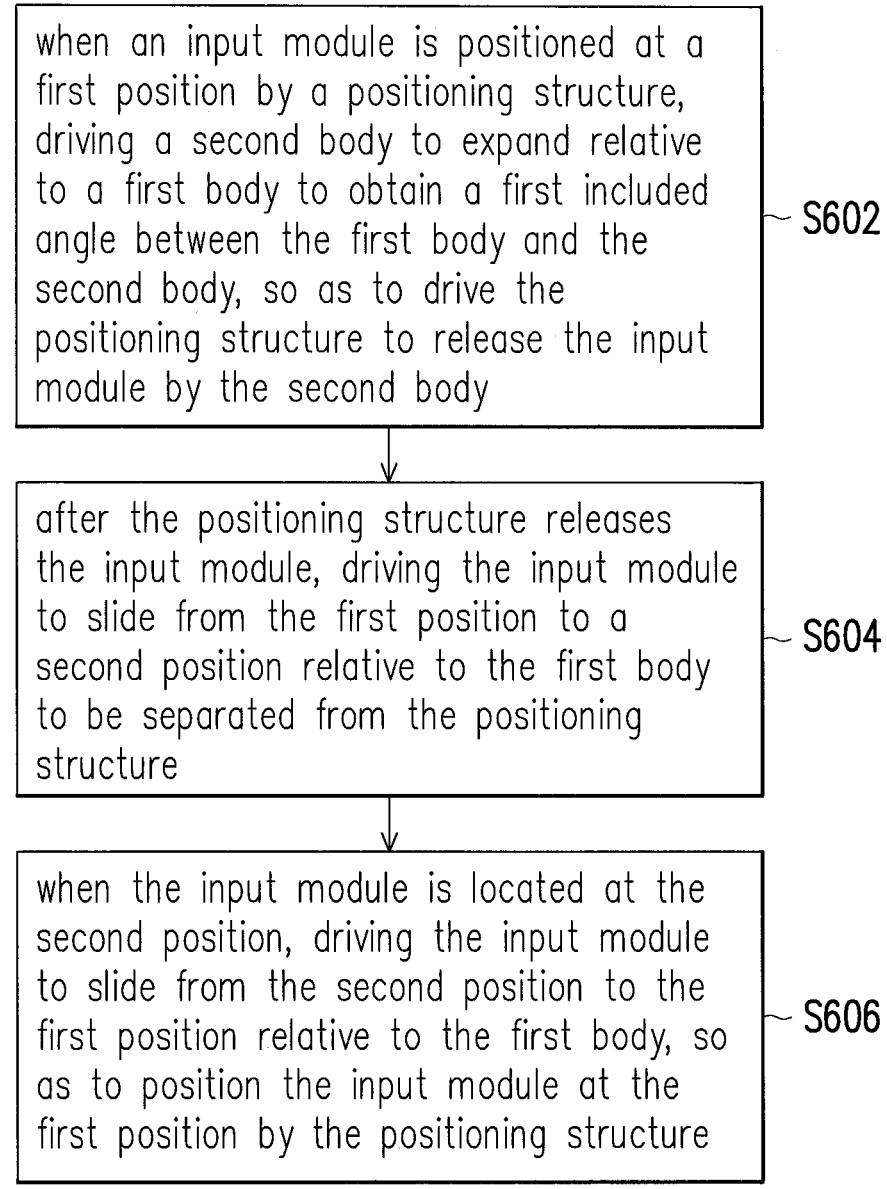
FIG. 8 is a flowchart diagram illustrating an operating method of the electronic device depicted in FIG. 1.

Taking the electronic device 100 of the afore-described embodiment as an example in the following descriptions to illustrate the operating method of the electronic device in the invention, FIG. 8 is a flowchart diagram illustrating an operating method of the electronic device depicted in FIG. 1. Referring to FIG. 1, when the input module 120 is positioned at a first position P1 by the positioning structure 112 (as shown in FIG. 1 and FIG. 2), the second body 130 is driven to expand relative to the first body 110 to obtain a first included angle A1 between the first body 110 and the second body 130 as shown in FIG. 3A, so as to drive the positioning structure 112 to release the input module 120 by the second body 130 (step S602). After the positioning structure 112 releases the input module 120, the input module 120 is driven to slide from the first position P1 to a second position P2 shown in FIG. 3C relative to the first body 110, and is separated from the positioning structure 112 (step S604). When the input module 120 is located at the second position P2, the input module 120 is driven to slide from the second position P2 to the first position P1 relative to the first body 110 as shown in FIG. 3D, so as to position the input module 120 at the first position P1 by the positioning structure 112 (step S606). In addition, the operating method of the electronic device 100 may further include the following steps. When a second included angle A2 greater than the first included angle A1 exists between the first body 110 and the second body 130 and the input module 120 is positioned at the first position P1 by the positioning structure 112 (as shown in FIG. 3D and FIG. 6), the second body 130 is driven to pivot relative to the first body 110 so that the second included angle A2 is reduced to a third included angle A3 (as shown in FIG. 3E), so as to drive the positioning structure 112 to release the input module 120 by the second body 130.

Figure 9:
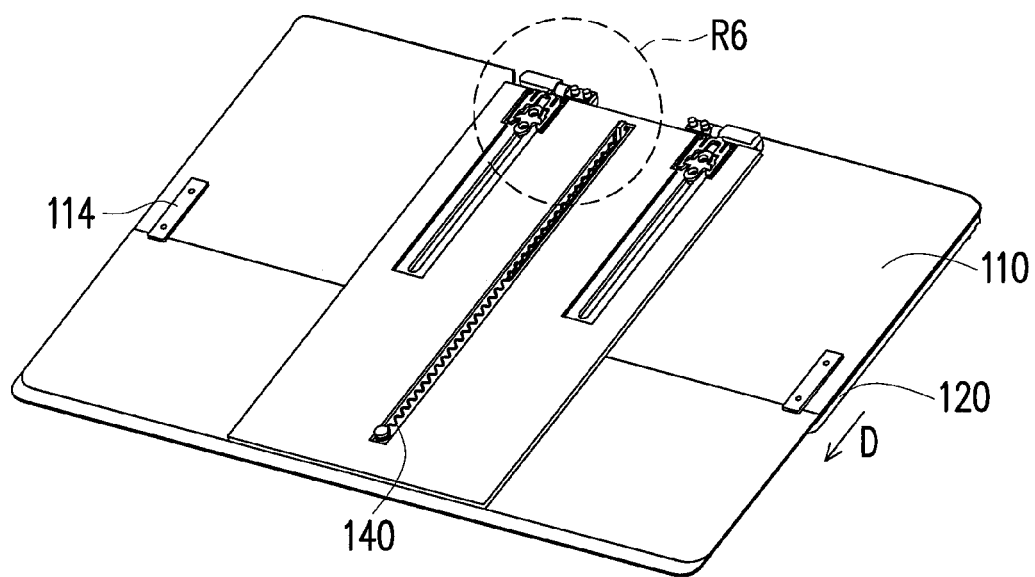
FIG. 9 is a three-dimensional diagram illustrating a portion of elements of the electronic device depicted in FIG. 1.
Figure 10:
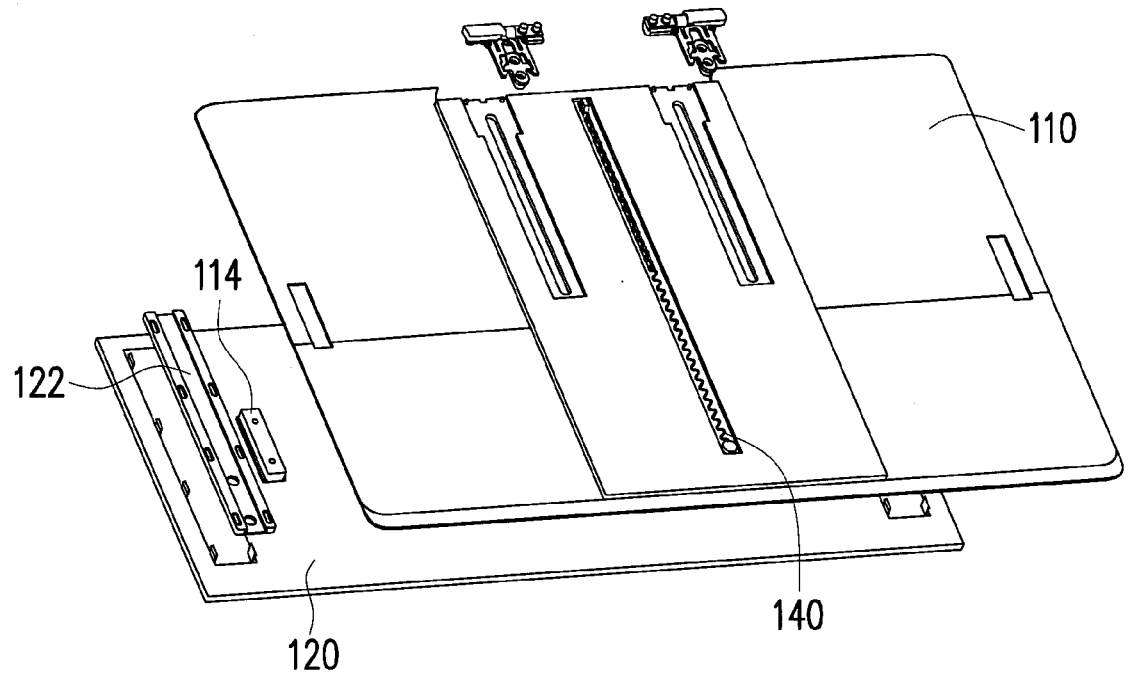
FIG. 10 is an exploded diagram illustrating the electronic device depicted in FIG. 9.
Figure 11:
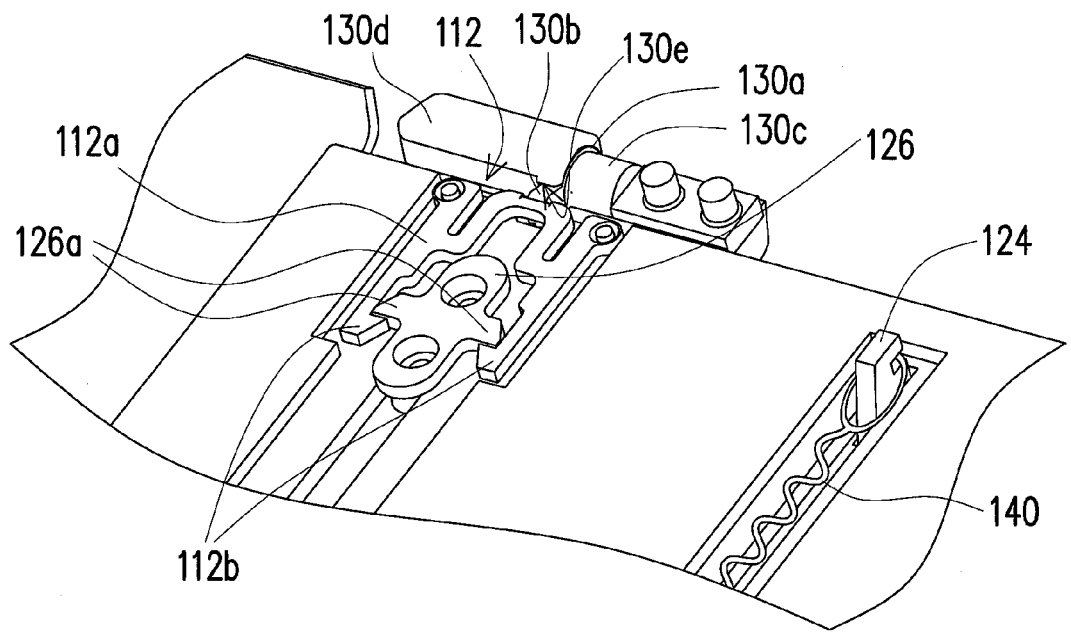
FIG. 11 is an enlarged diagram illustrating a region R6 of the electronic device depicted in FIG. 9.

FIG. 9 is a three-dimensional diagram illustrating a portion of elements of the electronic device depicted in FIG. 1. FIG. 10 is an exploded diagram illustrating the electronic device depicted in FIG. 9. FIG. 11 is an enlarged diagram illustrating a region R6 of the electronic device depicted in FIG. 9. Referring to FIG. 9 through FIG. 11, the first body 110 of the embodiment has at least one sliding portion 114, and the input module 120 has at least one sliding portion 122. The first body 110 and the input module 120 are slidably disposed relative to each other by the sliding portion 114 and the sliding portion 122 along the direction D. The input module 120 has a connecting portion 124, and the electronic device 100 (as indicated in FIG. 1) further includes an elastic element 140, in which an end of the elastic element 140 is connected to the connecting portion 124 of the input module 120, and another end of the elastic element 140 is connected to the first body 110, such that the elastic element 140 is connected between the first body 110 and the input module 120. The positioning structure 112 includes at least one elastic positioning element 112a. The input module 120 has at least one positioning portion 126, and is positioned at the first position P1 shown in FIG. 1 by a structural interference (as shown in FIG. 11) between the positioning portion 126 and the elastic positioning element 112a.

When the second body 130 pushes against the elastic positioning element 112a via the protrusion 130b of the pushing element 130a as shown in FIG. 4 so that the elastic positioning element 112a is elastically deformed, the structural interference between the positioning portion 126 and the elastic positioning element 112a is removed to release the input module 120. Specifically, the structural interference is performed by bumps 126a of the positioning portion 126 and hooks 112b of the elastic positioning element 112a. When the protrusion 130b of the pushing element 130a pushes against the elastic positioning element 112a, the elastic positioning element 112a is elastically deformed, such that the hooks 112b are moved away from the bumps 126a, so as to remove the afore-described structural interference.

When the positioning structure 112 releases the input module 120, the input module 120 is capable of sliding from the first position P1 shown in FIG. 3A to the second position P2 shown in FIG. 3C relative to the first body 110 through an elastic force of the elastic element 140. In the embodiment, the elastic positioning element 112a, the elastic element 140, the connecting portion 124 of the input module 120 and the positioning portion 126 of the input module 120 may be all hidden in the first body 110 to prevent the appearance of the electronic device 100 being affected, for instance.

Referring to FIG. 3A, in the embodiment, the second body 130 is connected to the input module 120 in a pivoting manner, for instance. When the second body 130 is expanded relative to the first body 110 to obtain the first included angle A1 between the first body 110 and the second body 130 as shown in FIG. 3A and FIG. 4, the positioning structure 112 may release the input module 120 as described above. At this moment, the included angle (i.e., the first included angle A1) between the first body 110 and the second body 130 is smaller and the second body 130 has a certain amount of weight. Therefore, the elastic force may be difficult to drive the input module 120 and the second body 130 from the state shown in FIG. 3A to the state shown in FIG. 3C, under the condition that the elastic force of the elastic element 140 (as shown in FIG. 9) is limited. In other words, when the first included angle A1 exists between the first body 110 and the second body 130, the second body 130 may resist the elastic force of the elastic element 140 (as shown in FIG. 9) and prevent the input module 120 sliding from the first position P1 toward the second position P2 relative to the first body 110, for instance. The user may apply a force to the second body 130 shown in FIG. 3A, so that the second body 130 continuously expands to the state shown in FIG. 3B relative to the first body 110. At this moment, the first included angle A1 shown in FIG. 3A is increased to a greater fourth included angle A4 shown in FIG. 3B, and the input module 120 begins to separate from the positioning structure 112 through the elastic force of the elastic element 140 (as shown in FIG. 9) and slide to the second position P2 shown in FIG. 3C relative to the first body 110. In the embodiment, the first included angle A1, the second included angle A2, the third included angle A3 and the fourth included angle A4 described above may be subject to the relationship A4>A2>A1>A3, for instance.

Referring to FIG. 1, in the embodiment, the second body 130 includes a main body 132 and a supporting assembly 134. The supporting assembly 134 is pivoted with the first body 110, and the main body 132 is slidably disposed on the supporting assembly 134. The main body 132 of the embodiment may be a touch display screen, for instance. When the supporting assembly 134 is pivoted relative to the first body 110 and the input module 120 is slid to the second position P2 shown in FIG. 3C, the main body 132 may be closer to the user, so as to facilitate the user to perform touch operation on the main body 132. When the supporting assembly 134 is pivoted relative to the first body 110 and the main body 132 is slid to the state shown in FIG. 3F relative to the supporting assembly 134, the relative positions of the first body 110 and the main body 132 may be varied, in order for the user to adjust the tilting angle and the position of the main body 132 according to user's preference. In addition, the main body 132 may be prevented from wobbling due to the touch operation performed by the user, through the support of the supporting assembly 134 for the main body 132.

Referring to FIG. 2, in the embodiment, the second body 130 has a rotation shaft 130c and a housing 130d. The housing 130d may be a part of the supporting assembly 134 of the second body 130, for instance. The rotation shaft 130c is disposed in the housing 130d, and the supporting assembly 134 of the second body 130 is pivoted with the first body 110 by the rotation shaft 130c. The pushing element 130a may be, for instance, a ring-shape, and is sleeved on the rotation shaft 130c. The housing 130d has an opening 130e, and the protrusion 130b of the pushing element 130a protrudes out of the housing 130d via the opening 130e of the housing 130d. When the second body 130 is pivoted relative to the first body 110, the housing 130d pushes the protrusion 130b of the pushing element 130a through an inner wall of the opening 130e, so that the pushing element 130a is driven through the pivot of the second body 130 relative to the first body 110, and the positioning structure 112 is driven to release the input module 120 through the protrusion 130b pushing against the positioning structure 112. In the embodiment, the opening 130e of the housing 130d may be designed to a diameter with appropriate size, such that the protrusion 130b of the pushing element 130a is capable of being pushed against by the inner wall of the opening 130e when the second body 130 is expanded or closed to a certain angle. In other embodiments, the diameter of the opening 130e may be varied according to the design requirement, although the invention is not limited thereto.

Figure 12:
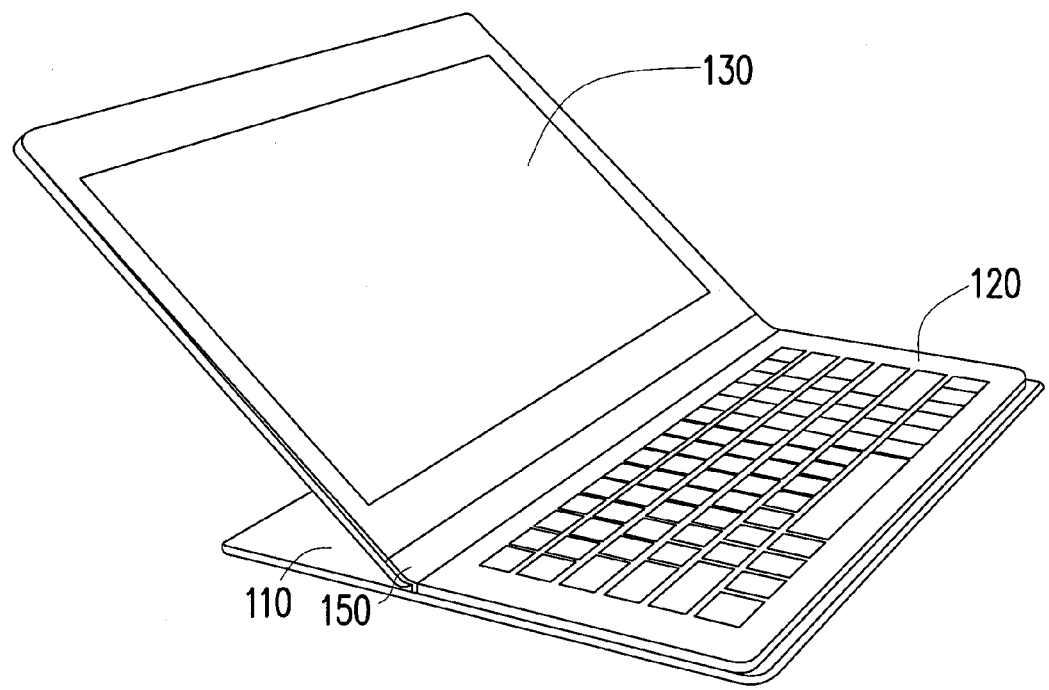
FIG. 12 is a three-dimensional diagram illustrating the electronic device depicted in FIG. 3C.

FIG. 12 is a three-dimensional diagram illustrating the electronic device depicted in FIG. 3C. Referring to FIG. 12, the electronic device 100 of the embodiment further includes a cover sheet 150 (not shown in FIG. 3C), in which the cover sheet 150 is connected between the second body 130 and the input module 120, and is configured to shield the pivot structure between the second body 130 and the input module 120, in order for the electronic device 100 to have a preferable appearance. The material of the cover sheet 150 may be, for instance, a flexible material, so that the cover sheet 150 is capable of being correspondingly deformed with the actuation of the second body 130 and the input module 120.

Figure 13A:
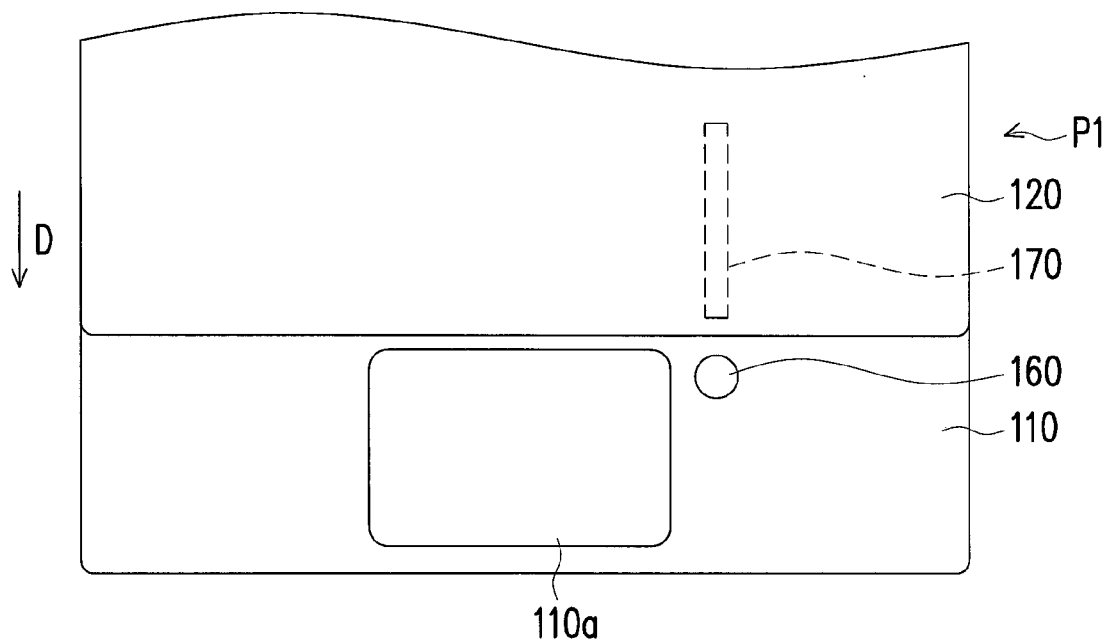
FIG. 13A is a schematic top-view diagram illustrating the first body and the input module depicted in FIG. 3A.
Figure 13B:
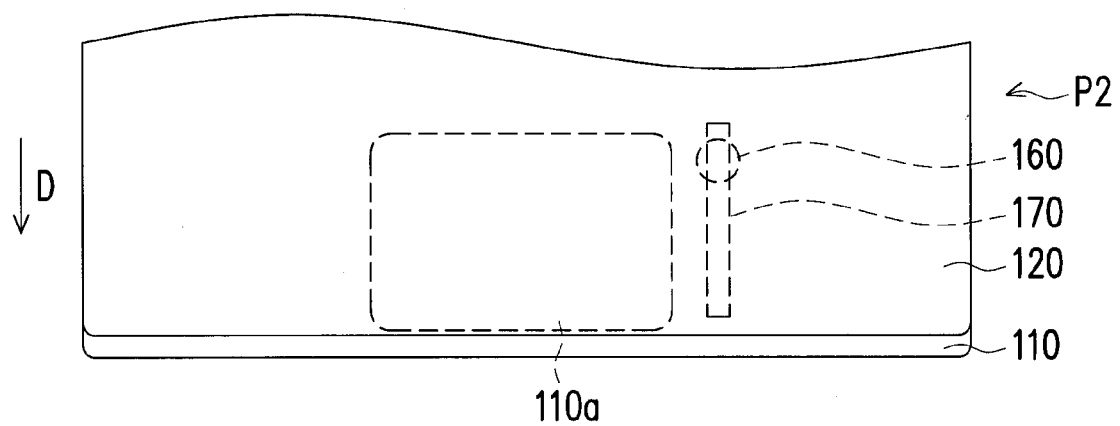
FIG. 13B is a schematic top-view diagram illustrating the first body and the input module depicted in FIG. 3C.

FIG. 13A is a schematic top-view diagram illustrating the first body and the input module depicted in FIG. 3A. FIG. 13B is a schematic top-view diagram illustrating the first body and the input module depicted in FIG. 3C. The input module 120 of the embedment is a keyboard, and a plurality of keys on the input module 120 are not illustrated in FIG. 13A and FIG. 13B in order for the drawings to be illustrated more clearly. Referring to FIG. 13A and FIG. 13B, in the embodiment, the electronic device 100 (as indicated in FIG. 3A and FIG. 3C) further includes a sensing element 160 and a sensing element 170, in which the sensing element 160 is disposed on the first body 110, the sensing element 170 is disposed on the input module 120 and the first body 110 has a touch module (i.e. touch panel or touch pad) 110a. When the input module 120 is slid to the first position P1 shown in FIG. 3A, the touch module 110a may be exposed as shown in FIG. 13A. At this moment, the user may perform touch input via the touch module 110a. When the input module 120 is slid to the second position P2 shown in FIG. 3C, the touch module 110a may be shielded by the input module 120 as shown in FIG. 13B. At this moment, the sensing element 160 and the sensing element 170 are triggered, and the first body 110 turns off the touch module 110a to prevent the touch module 110a being turned on continuously which consumes electricity.

In summary, the first body of the invention has the positioning structure that is configured to position the input module at the first position, and when the input module slides from the first position to the second position as the second body expands, the input module may be separated from the positioning structure. As described above, the input module is not continuously contacted with the positioning structure on the first body and after the second body is expanded relative to the first body, the protrusion of the pushing element is adapted to move away from the positioning structure through the pivot of the second body relative to the first body. Therefore, the user can push the input module located at the second position back to the first position under the condition that the second body is expanded, so as to facilitate adjusting the position of the input module according to the actual requirement, thereby improving utilization convenience of the electronic device. In addition, after the input module is positioned at the first position under the condition that the second body is expanded as described above, if the user intends to adjust the position of the input module again, the second body may be forced to drive the positioning structure to release the input module through the pivot of the second body, so as to further improve utilization convenience of the electronic device.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. An electronic device, comprising:
   a first body, having a positioning structure;
   an input module, slidably disposed on the first body and positioned at a first position by the positioning structure; and
   a second body, pivoted with the first body, wherein when the second body is expanded relative to the first body to obtain a first included angle between the first body and the second body, the second body drives the positioning structure to release the input module, so that the input module is capable of sliding from the first position to a second position relative to the first body and separating from the positioning structure,
   wherein when the second body is expanded relative to the first body, the positioning structure is adapted to position the input module by stopping the input module from moving away from the positioning structure.

2. The electronic device according to claim 1, wherein when the second body is expanded from the first body and the input module is forced to slide from the second position to the first position relative to the first body, the positioning structure positions the input module at the first position.

3. The electronic device according to claim 1, wherein when a second included angle greater than the first included angle exists between the first body and the second body and the input module is positioned at the first position by the positioning structure, the second body is adapted to pivot relative to the first body so that the second included angle is reduced to a third included angle, so as to drive the positioning structure to release the input module by the second body.

4. The electronic device according to claim 1, further comprising an elastic element, wherein the elastic element is connected between the first body and the input module, and when the positioning structure releases the input module, the input module is capable of sliding from the first position to the second position relative to the first body through an elastic force of the elastic element.

5. The electronic device according to claim 4, wherein the second body is connected to the input module, and when the positioning structure releases the input module and the first included angle exists between the first body and the second body, the second body resists the elastic force of the elastic element to prevent the input module sliding from the first position to the second position relative to the first body, and when the second body continuously expands relative to the first body so that the first included angle is increased to a fourth included angle, the input module slides from the first position to the second position relative to the first body through the elastic force of the elastic element.

6. The electronic device according to claim 1, wherein the second body comprises a main body and a supporting assembly, the supporting assembly is pivoted with the first body, the main body is slidably disposed on the supporting assembly, and when the supporting assembly is pivoted relative to the first body so that the main body expands from the first body, the main body is adapted to slide relative to the supporting assembly, so as to vary a relative position of the first body and the second body.

7. The electronic device according to claim 1, wherein the positioning structure comprises an elastic positioning element, the input module has a positioning portion and is positioned at the first position by a structural interference between the positioning portion and the elastic positioning element, and when the second body pushes against the elastic positioning element so that the elastic positioning element is elastically deformed, the structural interference between the positioning portion and the elastic positioning element is removed to release the input module.

8. The electronic device according to claim 1, wherein the second body has a rotation shaft and is pivoted with the first body by the rotation shaft, a pushing element is disposed on the rotation shaft, the pushing element has a protrusion, and the pushing element is adapted to be driven through a pivot of the second body relative to the first body, so that the protrusion pushes against the positioning structure to drive the positioning structure to release the input module.

9. The electronic device according to claim 8, wherein after the second body is expanded relative to the first body, the protrusion is adapted to move away from the positioning structure through the pivot of the second body relative to the first body.

10. The electronic device according to claim 8, wherein the second body has a housing, the rotation shaft is disposed in the housing, the housing has an opening, the protrusion protrudes out of the housing via the opening, and when the second body is pivoted relative to the first body, the housing pushes the protrusion through an inner wall of the opening.

11. The electronic device according to claim 1, further comprising at least one sensing element, wherein the sensing element is disposed on the first body or the input module, the first body has a touch module, the input module slides to the first position to expose the touch module or slides to the second position to shield the touch module, and when the input module slides to the second position to trigger the sensing element, the first body turns the touch module off.

12. An operating method of an electronic device, the electronic device comprising a first body, an input module and a second body, the first body having a positioning structure, the input module slidably disposed on the first body, the second body pivoted with the first body, and the operating method comprising:
   when the input module is positioned at a first position by the positioning structure, driving the second body to expand relative to the first body to obtain a first included angle between the first body and the second body, so as to drive the positioning structure to release the input module by the second body;
   after the positioning structure releases the input module, driving the input module to slide from the first position to a second position relative to the first body to be separated from the positioning structure; and
   when the second body is expanded relative to the first body and the input module is located at the second position, driving the input module to slide from the second position to the first position relative to the first body, so as to position the input module at the first position by the positioning structure stopping the input module from moving away from the positioning structure.

13. The operating method according to claim 12, further comprising:
  when a second included angle greater than the first included angle exists between the first body and the second body and the input module is positioned at the first position by the positioning structure, driving the second body to pivot relative to the first body so that the second included angle is reduced to a third included angle, so as to drive the positioning structure to release the input module by the second body.

* * * * *